(12) United States Patent
Condie et al.

(10) Patent No.: US 7,429,790 B2
(45) Date of Patent: Sep. 30, 2008

(54) SEMICONDUCTOR STRUCTURE AND METHOD OF MANUFACTURE

(75) Inventors: Brian W. Condie, Mesa, AZ (US); Lakshminarayan Viswanathan, Phoenix, AZ (US); Richard W. Wetz, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 230 days.

(21) Appl. No.: 11/257,783

(22) Filed: Oct. 24, 2005

(65) Prior Publication Data

US 2007/0090514 A1    Apr. 26, 2007

(51) Int. Cl.
 *H01L 23/10* (2006.01)
(52) U.S. Cl. ...................... 257/709; 257/787
(58) Field of Classification Search ................ 257/787, 257/707, 708, 796, 709, 710, 706, 782, 783
 See application file for complete search history.

(56) References Cited

U.S. PATENT DOCUMENTS

| 3,778,887 | A | * | 12/1973 | Suzuki et al. ................. 29/827 |
| 4,994,897 | A | * | 2/1991 | Golubic et al. ............. 257/667 |
| 5,138,430 | A | * | 8/1992 | Gow et al. .................. 257/712 |
| 5,278,446 | A | * | 1/1994 | Nagaraj et al. .............. 257/707 |
| 5,378,924 | A | * | 1/1995 | Liang .......................... 257/675 |
| 5,701,034 | A | * | 12/1997 | Marrs .......................... 257/706 |
| 6,072,211 | A | | 6/2000 | Miller et al. |
| 6,072,238 | A | | 6/2000 | Visawanthan et al. |
| 6,261,868 | B1 | | 7/2001 | Miller et al. |
| 6,511,866 | B1 | | 1/2003 | Bregante et al. |
| 6,713,849 | B2 | * | 3/2004 | Hasebe et al. ............... 257/667 |
| 6,867,367 | B2 | | 3/2005 | Zimmerman |
| 6,943,433 | B2 | * | 9/2005 | Kamada ..................... 257/666 |
| 7,224,047 | B2 | * | 5/2007 | Carberry et al. ............. 257/676 |
| 2006/0108673 | A1 | * | 5/2006 | Germain et al. ............. 257/678 |

FOREIGN PATENT DOCUMENTS

JP    9-107059    *    4/1997

* cited by examiner

*Primary Examiner*—S. V Clark
(74) *Attorney, Agent, or Firm*—Bryan Cave LLP (57) ABSTRACT

A semiconductor structure (100) includes a substrate (110) having a first surface (111) with a mold lock feature (101). The semiconductor structure also includes a semiconductor chip (120) located over the first surface of the substrate. The semiconductor structure further includes an electrical isolator structure (340) located over the first surface of the substrate. The electrical isolator structure includes an electrical lead (341, 342) and an electrically insulative element (343) molded to the electrical lead. An optional portion (444) of the electrical isolator structure is located in the mold lock feature. The semiconductor structure additionally includes an adhesive element (450) located between and coupling the electrical isolator structure and the first surface of the substrate.

27 Claims, 6 Drawing Sheets

SEMICONDUCTOR STRUCTURE AND METHOD OF MANUFACTURE

FIELD OF THE INVENTION

This invention relates generally to semiconductor devices, and relates more particularly to packaging for semiconductor devices.

BACKGROUND OF THE INVENTION

Semiconductor die or chips are encapsulated in a semiconductor package for protection from damage by external stresses and to provide a system for carrying electrical signals to and from the chips. Many different types of semiconductor packages exist, including dual-in-line packages, pin grid array packages, tape-automated bonding (TAB) packages, multi-chip modules (MCMs), and power packages. One type of power packages is a radio frequency (RF) power package, which are typically used when a semiconductor device in the semiconductor chip dissipates a power greater than approximately ten watts and operates at a frequency greater than approximately one hundred MegaHertz (MHz). RF power packages often include an air gap inside for lower power loss and better RF performance.

Current high power RF semiconductor packages use ceramic insulators, which are often called "frames," that are brazed or soldered to a metal source substrate. However, the ceramic insulators are expensive and have poor mechanical tolerances.

Another high power RF semiconductor package is described in U.S. Pat. No. 6,511,866, issued on Jan. 28, 2003 to Bregante et al., and uses a polymer insulator or polymer-based frame. However, this package has potential reliability problems due to an inherently weak polymer/metal interface between the frame and a nickel and/or gold-based surface of the substrate. The poor seal is due to difficulty in creating a mechanically robust and consistent epoxy joint between the frame and the metal source substrate. Additionally, this package also has a high potential for mechanical failure at this polymer/metal interface in view of the new lead-free and other Restriction of Hazardous Substances Directive (RoHS) requirements that are being forced on the industry. Furthermore, this packaging also has potentially poor mechanical integrity under final mounting conditions.

Yet another high power RF semiconductor package is described in U.S. Pat. No. 6,867,367, issued on Mar. 15, 2005 to Zimmerman. However, this package uses a proprietary, high-temperature polymer material, which is molded to the metal source substrate before attaching the semiconductor chip to the substrate. Completing the package before the chip attach step creates mechanical reliability problems between the frame and the metal source substrate due to the high temperatures needed to attach or mount the semiconductor chip to the metal source substrate. Completing the package before the chip attach step may also limit the chip attach options. For example, if the polymer melts or degrades at four hundred degrees Celsius, then a gold silicon chip attach process occurring at over four hundred degrees Celsius cannot be used.

Accordingly, a need exists for a new high power RF semiconductor packaging that is less expensive than ceramic-based packages and that and has improved reliability over current polymer-based, air-cavity packages.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, chemical, or other manner.

DETAILED DESCRIPTION OF EXEMPLARY EMBODIMENTS

Various embodiments of the present invention include a semiconductor structure or semiconductor packaging system and a process of assembly where a substrate or flange has one or more mold lock features for an adhesive. The mold lock features are a mechanical reinforcement for an organic adhesive bond between the substrate and an electrical isolator structure and improve the mechanical reliability of the organic adhesive bond.

In some of these embodiments, the electrical isolator structure also includes one or more protrusions. As an example, a portion of the electrical isolator structure protrudes into or mates with a recess of the mold lock features, and this mating can inhibit crack propagation along the interface between the organic adhesive and the electrical insulator structure and/or along the interface between the organic adhesive and the substrate. The portion of the electrical isolator structure protruding into the recess of the mold lock features can also increase the moisture leak path for ingress to the electronic component or semiconductor structure. Input/output leads are also molded or embedded into the plastic insulator frame, which can reduce piece-part costs, improve dimensional tolerances, and enable multiple lead structures.

In some embodiments, the substrate also has an organic adhesive dam and inhibits organic adhesive run-out or ingress. In the same or other embodiments, the substrate also has an alignment feature to improve the alignment between the substrate and the electrical isolator structure, which, in turn, improves electrical performance of the electronic component or semiconductor structure.

Additionally, some embodiments of the invention can include a process of assembly where: (1) a semiconductor chip is attached or coupled to the source flange having one or more mold lock features; (2) the electrical isolator structure with the leads mates with the mold lock features and snaps together with or otherwise couples to the substrate; (3) an organic adhesive between the electrical isolator structure and the substrate is cured to form a strong bond between these two pieces; (4) the semiconductor chip is wire bonded to the leads; and (5) a lid is bonded to the electrical isolator structure to create a hermetic enclosure or at least a gross leak enclosure.

This process of assembly uses the mold lock features improve the mechanical reliability of the semiconductor structure or semiconductor packaging system. This process also permits the high temperature semiconductor chip or die attach to occur before attaching the electrical insulator structure to the substrate so that the high temperature die attach step does not degrade the bond between the electrical insulator structure and the substrate.

Figure 1:
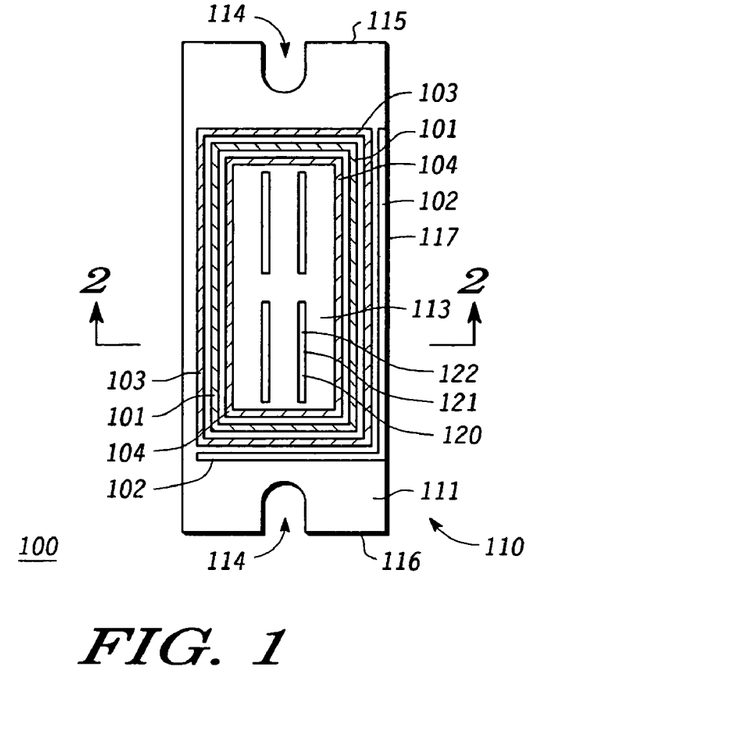
FIG. 1 illustrates a top view of a semiconductor structure in accordance with an embodiment of the invention.
Figure 2:
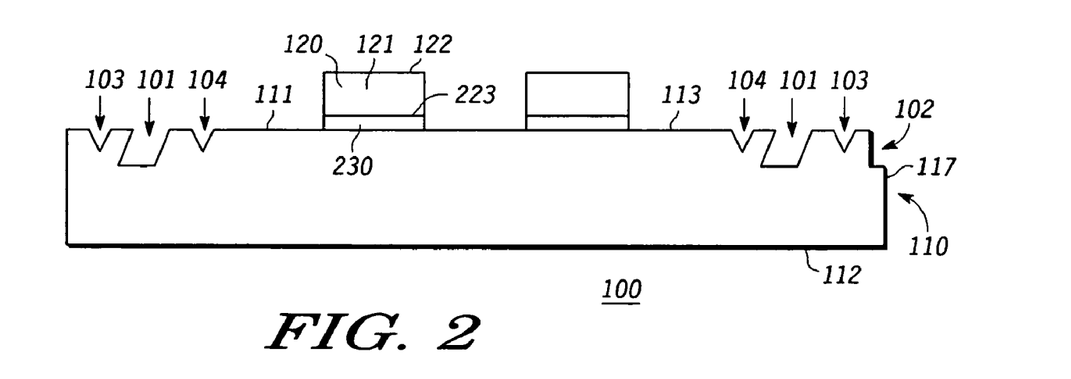
FIG. 2 illustrates a cross-sectional view of the semiconductor structure in FIG. 1, as viewed along a section line 2-2 in FIG. 1, in accordance with an embodiment of the invention.

Referring now to the figures, FIG. 1 illustrates a top view of a semiconductor packaging system or semiconductor structure 100, and FIG. 2 illustrates a cross-sectional view of semiconductor structure 100 as viewed along a section line 2-2 in FIG. 1. Semiconductor structure 100 includes a substrate 110 that has a surface 111 and a surface 112 opposite surface 111. In some embodiments, substrate 110 is referred to as a flange. In the same or different embodiment, substrate 110 serves as a heat sink or heat spreader. In each of these embodiments, substrate 110 can comprise a thermally and/or electrically conductive material such as, for example, copper (Cu), copper-based composites, copper-based laminates, aluminum silicon carbide (AlSiC), copper graphite, diamond, and/or the like. Examples of copper-based composites include copper tungsten (CuW) and copper molybdenum (CuMo), and an example of a copper-based laminate is copper molybdenum copper (CuMoCu).

Surface 111 of substrate 110 can also have at least one mold lock feature 101. As explained below, mold lock feature 101 can improve the reliability of an organic adhesive-based or other adhesive-based bond between substrate 110 and an electrical isolator structure (also explained below). In the embodiment illustrated in FIGS. 1 and 2, mold lock feature 101 comprises a recess having a rectangular, window-frame shape across surface 111 of substrate 110 and a parallelogram shape into surface 111 of substrate 110. As an example, mold lock feature 101 can have a depth of approximately 100-400 micrometers (μm) and a width of approximately 200-2,000 μm. Mold lock feature 101 can also be described as comprising four mold lock features or straight grooves coupled together to form a continuous ring, groove, or recess adjacent to a perimeter of substrate 110.

In a different embodiment, the recess of mold lock feature 101 can have other shapes, geometries, depths, and configurations. For example, mold lock feature 101 can comprise a multitude of discrete recesses dispersed uniformly or non-uniformly adjacent to the perimeter of substrate 110. The one or more separated recesses of mold lock feature 101 can be formed into substrate 110 during the stamping process used to form substrate 110. Substrate 110 can be part of a lead frame structure or can be an individual element. The one or more recesses of mold lock feature 101 can also be one or more through-holes in substrate 110. When mold lock feature 101 comprises two or more discrete recesses, the recesses can be symmetric or asymmetric with each other.

In another embodiment, mold lock feature 101 can comprise at least one protrusion extending from surface 111 of substrate 110. In yet another embodiment, mold lock feature 101 can be a combination structure comprising one or more recesses and one or more protrusions.

Surface 111 of substrate 110 can also have at least one optional alignment feature 102. As explained below, alignment feature 102 can be used to improve consistency in assembly by improving assembly tolerances, thus enhancing the electrical performance of semiconductor structure 100. In the embodiment illustrated in FIGS. 1 and 2, alignment feature 102 comprises a recess having a rectangular shape into surface 111 of substrate 110 and having a depth of approximately 100-400 micrometers (μm) and a width of approximately 200-1,000 μm. FIG. 1 also illustrates alignment feature 102 comprising two features or grooves coupled together to form a continuous L-shaped groove across surface 111 of substrate 110 and adjacent to the perimeter of substrate 110 at two adjacent sides 116 and 117 of substrate 110. In the embodiment illustrated in FIGS. 1 and 2, alignment feature 102 forms a portion of side 117 of substrate 110 and a portion of an edge of surface 111 of substrate 110. Alignment feature 102 can also have other shapes, geometries, depths, heights, and configurations, as explained previously for mold lock feature 101.

Surface 111 of substrate 110 can also have one or more of optional dams 103 and 104. As explained below, dams 103 and 104 can be used to inhibit adhesive run-out problems in semiconductor structure 100 and, accordingly, can be referred to as adhesive dams. In the embodiment illustrated in FIGS. 1 and 2, dams 103 and 104 each comprises a recess having a rectangular window-frame shape across surface 111 of substrate 110 and having a triangular shape into surface 111 of substrate 110. As an example, dams 103 and 104 can each have a depth of approximately 100-400 micrometers (μm) and a width of approximately 200-1,000 μm. FIG. 1 also illustrates each of dams 103 and 104 to comprise four features or grooves coupled together to form a continuous ring or groove adjacent to the perimeter of substrate 110. Dams 103 and 104 can also have other shapes, geometries, depths, heights, and configurations, as explained previously for mold lock feature 101. In one embodiment of semiconductor structure 100, substrate 110 has only one of dams 103 and 104, and in another embodiment of semiconductor structure 100, substrate does not have any of dams 103 or 104.

As illustrated in FIGS. 1 and 2, dams 103 and 104 and mold lock feature 101 can be concentric features. Mold lock feature 101 is located between dams 103 and 104 to prevent an adhesive (described below) from running-out too far across surface 111 of substrate 110. Dam 104 is located between mold lock feature 101 and a center or central region of substrate 110 where one or more semiconductor chips (described below) are located.

A portion of surface 111 of substrate 110 can include a layer 113 that overlies the electrically conductive material of substrate 110. Layer 113 can be a metal layer or a solderable metal layer. When layer 113 is a solderable metal layer, layer 113 provides a solderable surface for substrate 110. As an example, layer 113 can be a solderable surface comprised of nickel and gold. In this particular embodiment, layer 113 can comprise a layer of gold and a layer of nickel between the layer of gold and the electrically conductive material of substrate 110. In another embodiment, layer 113 can comprise nickel cobalt (NiCo) and gold (Au). As an example, layer 113 can be plated onto substrate 110 and can also be located on other surfaces of substrate 110, including surface 112.

In one embodiment, layer 113 is located at a first portion of surface 111 of substrate 110, and layer 113 is absent at a second portion of surface 111 of substrate 110. As an example, the first portion can be a central portion of surface 111, and the second portion can be a perimeter portion of surface 111. In this embodiment, the perimeter portion of surface 111 is comprised of copper, nickel, or other core materials for substrate 110 that are more conducive to an epoxy or other non-solder adhesive joint, than a gold-based or silver-based surface like layer 113. As an example, layer 113 can be selectively plated onto the central portion of surface 111 of substrate 110 such that layer 113 is not contiguous with mold lock feature 101, alignment feature 102, or dams 103 and 104.

Dam 104 can separate the first portion of surface 111 of substrate 110 from the second portion of surface 111 of substrate 110. In this embodiment, dams 103 and 104, mold lock feature 101, and alignment feature 102 are located in the second portion of surface 111 of substrate 110 and are devoid of a solderable surface. Also in this embodiment, the second portion and thus, dams 103 and 104, mold lock feature 101, and alignment feature 102 are located between the first portion and the edges of surface 111 of substrate 110.

Substrate 110 can also include optional mounting holes or recesses 114. FIG. 1 depicts two recesses, but the specific quantity of recesses may vary. Recesses 114 can be located at opposite sides 115 and 116 of substrate 110. Recesses 114 can be used to secure semiconductor structure 100 to another substrate such as, for example, a chassis, a heat sink, or a printed circuit board (PC board).

Semiconductor structure 100 also includes at least one semiconductor chip 120. FIG. 1 depicts four semiconductor chips, but the specific quantity of semiconductor chips may vary. Semiconductor chips 120 are located over the first portion (i.e., the central portion) of surface 111 of substrate 110.

In one embodiment, semiconductor chips 120 are comprised of one or more materials suitable for radio frequency or other high frequency devices. In a different or the same embodiment, semiconductor chips 120 are comprised of one or more materials suitable for high power devices. As an example, semiconductor chips 120 can comprise gallium arsenide (GaAs), silicon, (Si), gallium nitride (GaN), or the like. In most embodiments, semiconductor chips 120 can also be referred to as semiconductor die.

Each of semiconductor chips 120 includes at least one semiconductor device 121. Accordingly, semiconductor devices 121 are also located over surface 111 of substrate 110. At least one of semiconductor devices 121 is an active device (i.e., a transistor) and not merely a passive device (i.e., a resistor, a capacitor, an inductor, etc.). In an embodiment where semiconductor chips 120 are comprised of silicon, semiconductor devices 121 can be laterally diffused metal oxide semiconductor (LDMOS) devices. At least one of semiconductor devices 121 is an active device (i.e., a transistor) and not merely one or more passive devices (i.e., resistors, capacitors, inductors, etc.), but other ones of semiconductor devices 121 can be matching devices, such as, for example, integrated passive devices (IPDs) and metal-oxide-semiconductor capacitors (MOSCAPs). In a different embodiment, one or more of semiconductor chips 120 is replaced with one or more non-semiconductor components that are matching devices. Examples of these non-semiconductor components include IPDs and low temperature co-fired ceramic (LTCC) matching bricks.

Each of semiconductor chips 120 can have solderable surfaces 122 and 223 comprised of gold (Au), silver (Ag), nickel cobalt gold (NiCoAu), nickel gold (NiAu), or the like. All of surfaces 122 and 223 can be solderable, or only a portion of surfaces 122 and 223 can be solderable. In another embodiment where solder interconnects are not used for semiconductor structure 100, none of surface 122 is solderable.

Semiconductor structure 100 also includes an adhesive 230 located between and coupling together semiconductor chips 120 and surface 111 of substrate 110. In some embodiments, adhesive 230 can be electrically conductive. In these embodiments, adhesive 230 can electrically couple semiconductor chips 120 to substrate 110, which can serve as an electrical lead for semiconductor devices 121 in semiconductor chips 120. Accordingly, in these embodiments, substrate 110 can be referred to as a source substrate or source flange when substrate 110 is an electrical lead for a source electrode of semiconductor devices 121. Also in these embodiments, adhesive 230 includes several discrete or individualized portions.

In one embodiment, adhesive 230 can be any suitable chip or die attach material such as a lead-based or non-lead-based solder. In this embodiment, adhesive 230 can be referred to as a solder element. As an example, suitable non-lead-based solders include gold tin (AuSn), gold silicon (AuSi), or the like. In this embodiment, adhesive 230 solders together a portion of layer 113 at surface 111 and surface 223. When semiconductor chips 120 are comprised of silicon, adhesive 230 can be comprised of a material with a low coefficient of thermal expansion (CTE) such as gold silicon to more closely match the CTE of semiconductor chips 120. In other embodiment, adhesive 230 can be an electrically conductive or non-electrically conductive epoxy or a thermoset or thermoplastic polymer.

Adhesive 230 can be formed on solderable surface 223 of semiconductor chips 120 or on layer 113 of surface 111 of substrate 110 using cladding, plating, screen printing, or solder ball techniques. Adhesive 230 can also be a perform. As explained below, adhesive 230 can also have a melting temperature and a reflow temperature that are higher than melting and reflow temperatures for other adhesives, or solders, that are used during later stages of the manufacturing or assembly process for semiconductor structure 100.

Figure 3:
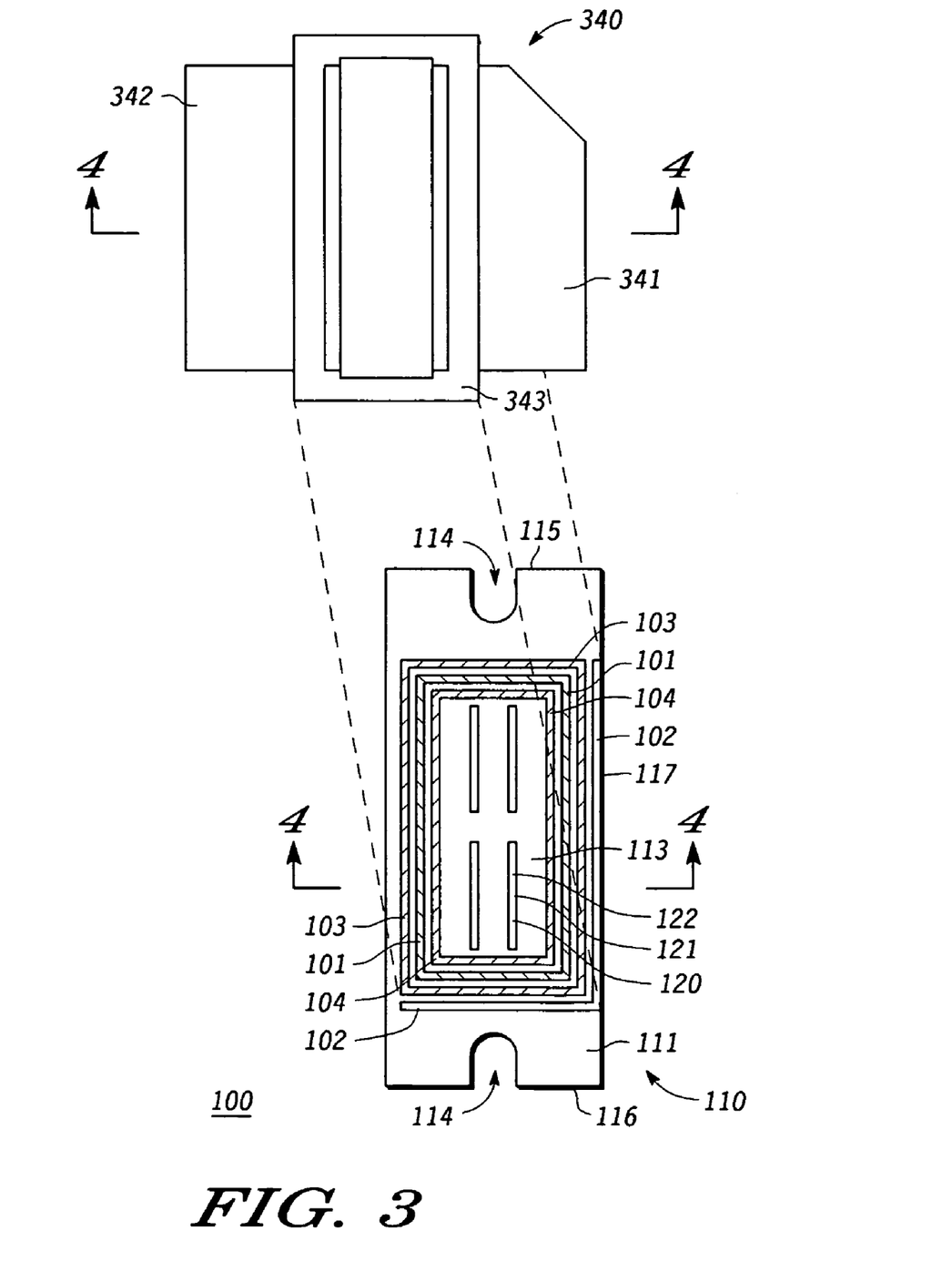
FIG. 3 illustrates an exploded top view of the semiconductor structure in FIG. 1 during a later step of the assembly process in accordance with an embodiment of the invention.
Figure 4:
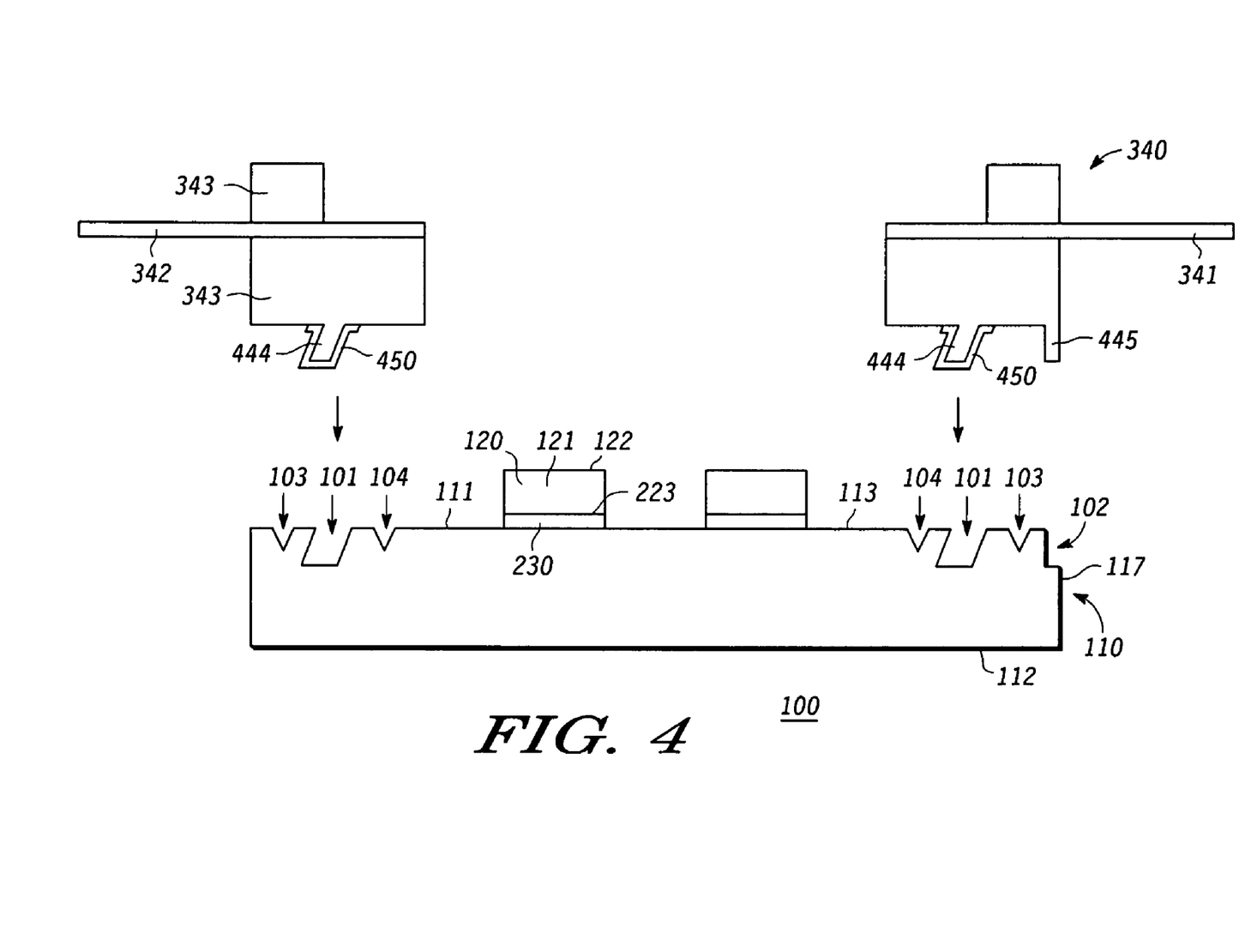
FIG. 4 illustrates a cross-sectional view of the semiconductor structure in FIG. 3, as viewed along a section line 4-4 in FIG. 3, in accordance with an embodiment of the invention.

FIG. 3 illustrates an exploded top view of semiconductor structure 100 during a later step of the assembly process, and FIG. 4 illustrates a cross-sectional view of semiconductor structure 100 as viewed along a section line 4-4 in FIG. 3. Semiconductor structure 100 additionally includes an electrical isolator structure 340 located over surface 111 of substrate 110. As illustrated in FIGS. 3 and 4, electrical isolator structure 340 includes two electrical leads 341 and 342. In general, however, electrical isolator structure 340 can include more or less than two electrical leads. Electrical leads 341 and 342 are used to conduct electrical signals to and from semiconductor devices 121 in semiconductor chips 120 and into and out of semiconductor structure 100. In one embodiment, electrical leads 341 and 342 can be gate and drain leads, respectively, for gate and drain electrodes of semiconductor devices 121. In this embodiment, substrate 110 can serve as a source lead for source electrodes of semiconductor devices 121.

As an example, electrical leads 341 and 342 can comprise electrically conductive materials including, for example, copper, a copper alloy, and other electrically conductive materials identified previously for substrate 110. Additionally, electrical leads 341 and 342 can comprise an iron-based alloy with nickel such as, for example, Alloy 42, whose composition comprises forty-two percent nickel. Electrical leads 341 and 342 can also comprise an iron-based alloy with nickel and cobalt, as sold under the brand name Kovar® by CRS Holdings, Inc., a Delaware corporation.

Electrical leads 341 and 342 can also include a solderable surface to make electrical leads 341 and 342 suitable for wire bonding or other interconnect schemes inside of semiconductor structure 100 and to make electrical leads 341 and 342 suitable for wire bonding or soldering outside of semiconductor structure 100. As an example, the solderable surface of electrical leads 341 and 342 can comprise the same solderable materials identified for layer 113 of substrate 110 (FIGS. 1 and 2) and solderable surfaces 122 and 223 of semiconductor chips 120.

Electrical isolator structure 340 also includes an organic-based element 343 molded to electrical leads 341 and 342. In some embodiments, organic-based element 343 can have the shape of a window frame, as illustrated in FIG. 3. In these embodiments, organic-based element 343 can be referred to as a frame, and electrical isolator structure 340 can be referred to as a frame structure. Organic-based element is comprised of an electrically insulative material such as, for example, a polymer, a thermoplastic, and/or a thermoset material. Accordingly, in some embodiments, organic-based element 343 can also be referred to as a plastic insulator frame.

Organic-based element 343 can be formed by using an injection, transfer, or other molding process to mold organic-based element 343 to electrical leads 341 and 342. The portion of organic-based element 343 located over leads 341 and 342 is optional and can be eliminated in some embodiments of semiconductor structure 100.

Electrical isolator structure 340 also includes an optional portion 444 over surface 111 of substrate 110. Portion 444 is optional such that some embodiments of electrical isolator structure 340 do not include portion 444. As illustrated in FIG. 4, portion 444 is a portion of organic-based element 343, but in other embodiments, portion 444 can be separate from organic-based element 343. In the illustrated embodiment of FIG. 4, portion 444 is a protrusion from organic-based element 343 that is designed to mate with mold lock feature 101 in substrate 110. Accordingly, where mold lock feature 101 comprises four grooves coupled together to form a continuous window-frame shaped groove adjacent to a perimeter of substrate 110, then portion 444 can comprise four protrusions coupled together to form a continuous window-frame shaped protrusion adjacent to the perimeter of substrate 110 and to a perimeter of organic-based element 343. In a different embodiment where mold lock feature 101 is a protrusion from surface 111 of substrate 110, then the shape, configuration, geometry, and size of portion 444 can be modified accordingly such that portion 444 still mates with mold lock feature 101.

In the illustrated embodiment of FIG. 4, portion 444 is conformal to the shape, configuration, geometry, and size of mold lock feature 101, but in other embodiments, portion 444 can have different shapes, configurations, geometries, and/or sizes and still mate with mold lock feature 101. For example, if mold lock feature 101 is a continuous groove adjacent to a perimeter of substrate 110, portion 444 can be a set of discrete protrusions adjacent to the perimeters of substrate 110 and organic-based element 343. As another example, if mold lock feature 101 has a parallelogram cross-section, portion 444 can have a parallelogram cross-section, a pentagon cross-section, a triangular cross-section, or a semi-circular cross-section.

In the preferred embodiment, portion 444 snaps together with mold lock feature 101 and anchors electrical isolator structure 340 to substrate 110. When portion 444 snaps together with mold lock feature 101, portion 444 has a tight fit with mold lock feature 101. In this embodiment, portion 444 can be conformal or non-conformal to mold lock feature 101.

Electrical isolator structure 340 further includes an optional portion 445 over surface 111 of substrate 110. Portion 445 is optional such that some embodiments of electrical isolator structure 340 do not include portion 445. In embodiments where electrical isolator structure 340 does include portions 444 or 445, the bottom surface of organic-based element 343 can be smooth or planar.

As illustrated in FIG. 4, portion 445 is also a portion of organic-based element 343, but in other embodiments, portion 445 can be separate from organic-based element 343. In the illustrated embodiment of FIG. 4, portion 445 is a protrusion from organic-based element 343 that is designed to mate with alignment feature 102 in substrate 110. Accordingly, when alignment feature 102 comprises two grooves coupled together to form an continuous L-shaped groove across surface 111 of substrate 110, then portion 445 can comprise two protrusions coupled together to form a continuous L-shaped protrusion across surface 111 of substrate 110 and across organic-based element 343. In a different embodiment where alignment feature 102 is a protrusion from surface 111 of substrate 110, then the shape, configuration, geometry, and size of portion 445 can be modified accordingly such that portion 445 still mates with alignment feature 102.

Other characteristics of portion 445 relative to alignment feature 102 can be similar to the previously described characteristics of portion 444 relative to mold lock feature 101, except that portion 445 and alignment feature 102 aid in the alignment of electrical isolator structure 340 to substrate 110 while portion 444 and mold lock feature 101 aid in forming a reliable joint between electrical isolator structure 340 and substrate 110. In some embodiments of semiconductor structure 100, alignment feature 102 and portion 445 can be eliminated where mold lock feature 101 and portion 444 provide both functions of alignment and increased joint reliability.

Semiconductor structure 100 also includes an adhesive element 450. Adhesive element 450 is located between electrical isolator structure 340 and surface 111 of substrate 110, and adhesive element 450 couples together electrical isolator structure 340 and substrate 110. More specifically, adhesive element 450 adheres together surface 111 of substrate 110 and organic-based element 343 of electrical isolator structure 340.

As an example, adhesive element 450 can comprise an epoxy material or other organic adhesives such as silicone, a pressure adhesive, or other thermoset or thermoplastic adhesives. Adhesive element 450 can have a shape similar to the window frame shape of organic-based element 343. Prior to being activated, adhesive element 450 can be comprised of a single piece, or it can be comprised of two or more discrete pieces. If adhesive element 450 originates as two or more discrete pieces, the step of melting, reflowing, or activating adhesive element 450 preferably combines the pieces so that adhesive element 450 becomes a single, unitary element.

In FIG. 4, adhesive element 450 is illustrated to be deposited on and adjacent to portion 444 of electrical isolator structure 340. In a different embodiment, adhesive element 450 can be deposited on the entire bottom surface of electrical isolator structure 340, including on portion 445 of electrical isolator structure 340. In an other embodiment, adhesive element 450 can be deposited on a portion of surface 111 of substrate 110. In this other embodiment, adhesive element 450 can be deposited on surface 111 before or after semiconductor chips 120 are attached or bonded to substrate 110. As a specific example of this other embodiment, adhesive element 450 can be deposited only in mold lock feature 101.

Figure 5:
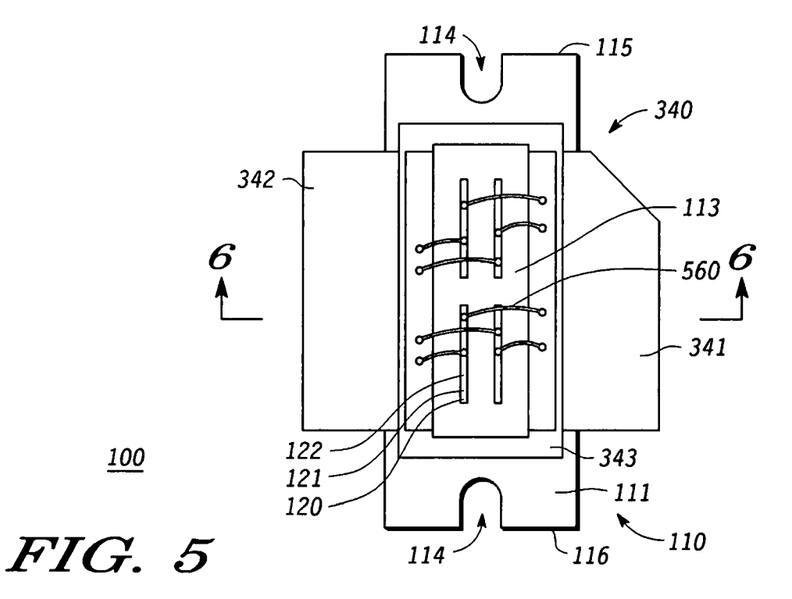
FIG. 5 illustrates a top view of the semiconductor structure in FIG. 3 during a later step of the assembly process in accordance with an embodiment of the invention.
Figure 6:
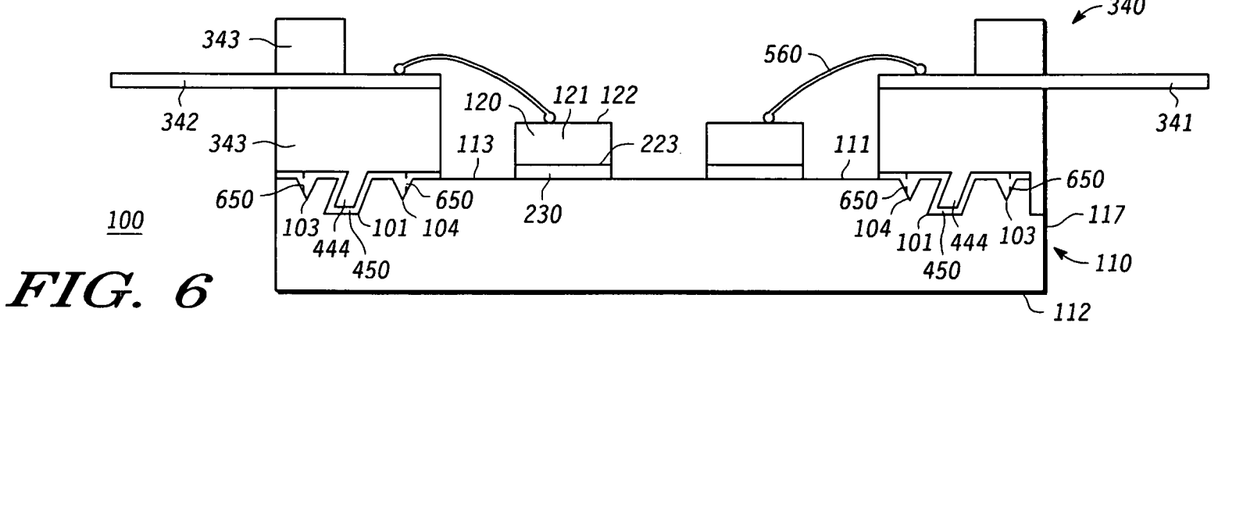
FIG. 6 illustrates a cross-sectional view of the semiconductor structure in FIG. 5, as viewed along a section line 6-6 in FIG. 5, in accordance with an embodiment of the invention.

FIG. 5 illustrates a top view of semiconductor structure 100 during an even later step of the assembly process, and FIG. 6 illustrates a cross-sectional view of semiconductor structure 100 as viewed along a section line 6-6 in FIG. 5. As illustrated in FIG. 6, several portions of electrical isolator structure 340 are mated with substrate 110. For example, portion 444 of electrical isolator structure 340 is mated with and located in mold lock feature 101. Additionally, portion 445 of electrical isolator structure 340 is mated with and located in alignment feature 102. Portion 445 and alignment feature 102 provide more precise alignment of electrical isolator structure 340 and substrate 110 relative to each other, which can improve the electrical performance of semiconductor structure 100.

Although mold locks have been used in other semiconductor components, those other semiconductor components mold a polymer-based frame directly to the substrate. Accordingly, the mold locks are used for and during the molding process. In semiconductor structure 100, however, mold lock feature 101 are not used for or during a molding process to create electrical isolator structure 340 or to couple electrical isolator structure 340 to substrate 110. Instead, mold lock feature 101 and portions 444 are used in an adhesive-attach or an epoxy-attach process. In particular, mold lock feature 101 and portions 444 mechanically couple together electrical isolator structure 340 and substrate 110 and/or mechanically reinforce the interface between electrical isolator structure 340 and substrate 110.

As also illustrated in FIG. 6, adhesive element 450 adheres electrical isolator structure 340 to substrate 110 and vice versa. Adhesive element 450 chemically couples together electrical isolator structure 340 and substrate 110. In the illustrated embodiment, portion 444 of electrical isolator structure 340 is smaller than mold lock feature 101 such that a portion of adhesive element 450 is also located in mold lock feature 101. For example, portion 444 can be smaller than mold lock feature 101 in the vertical direction or z-axis perpendicular to surface 111 of substrate 110, and/or portion 444 can be smaller than mold lock feature 101 in the horizontal direction or x- and/or y-axes parallel to surface 111 of substrate 110. In some embodiments, portion 444 in mold lock feature 101 can allow adhesive element 450 to seep or wick into mold lock feature 101 during the manufacturing or assembly of semiconductor structure 100.

Also in the illustrated embodiment, a portion of adhesive element 450 is also located in dams 103 and 104. In a particular embodiment, adhesive element 450 stops at dashed lines 650 and within dams 103 and 104. In this embodiment, dams 103 and 104 inhibit adhesive run-out towards the perimeter of substrate 110 and towards semiconductor chips 120, respectively. The process of coupling together electrical isolator structure 340 and substrate 110 can be performed in a vacuum to enhance the flow of adhesive element 450 into mold lock feature 101 and dams 103 and 104. In another embodiment, adhesive element 450 can also be located in alignment feature 102.

Semiconductor structure 100 additionally includes wire bonds 560 electrically coupling together semiconductor devices 121 in semiconductor chips 120 and electrical leads 341 and 342. As an example, wire bonds 560 comprise electrically conductive materials, as known in the art, such as, for example, gold, aluminum silicon, aluminum manganese, copper, lead-based solders such as lead tin silver, or the like. In other embodiments, wire bonds 560 are replaced with other electrical interconnect structures such as, for example, solder balls, flip-chip interconnects, tape automated bonding, (TAB), and the like.

Figure 7:
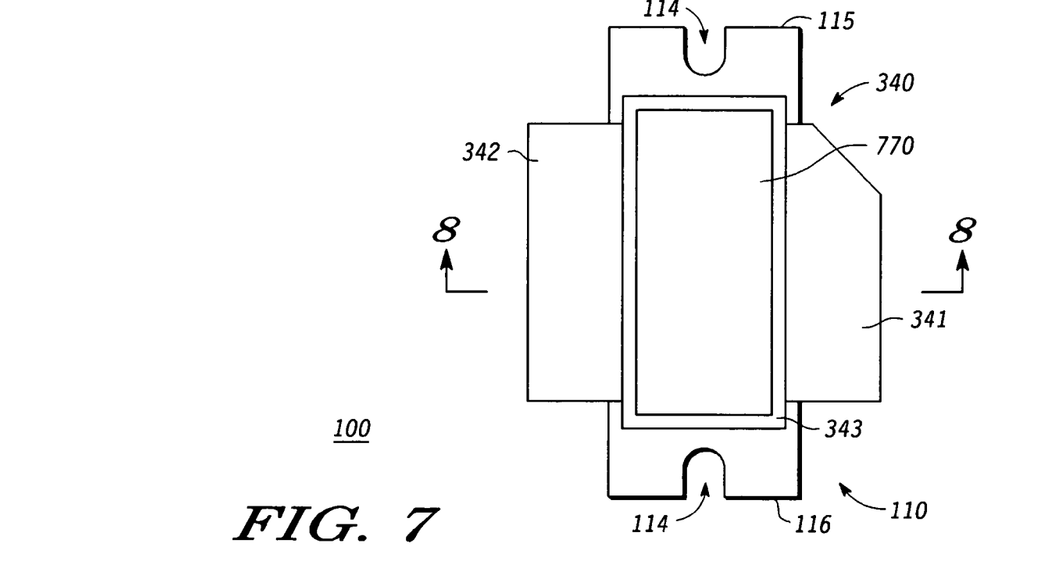
FIG. 7 illustrates a top view of the semiconductor structure in FIG. 5 during a later step of the assembly process in accordance with an embodiment of the invention.
Figure 8:
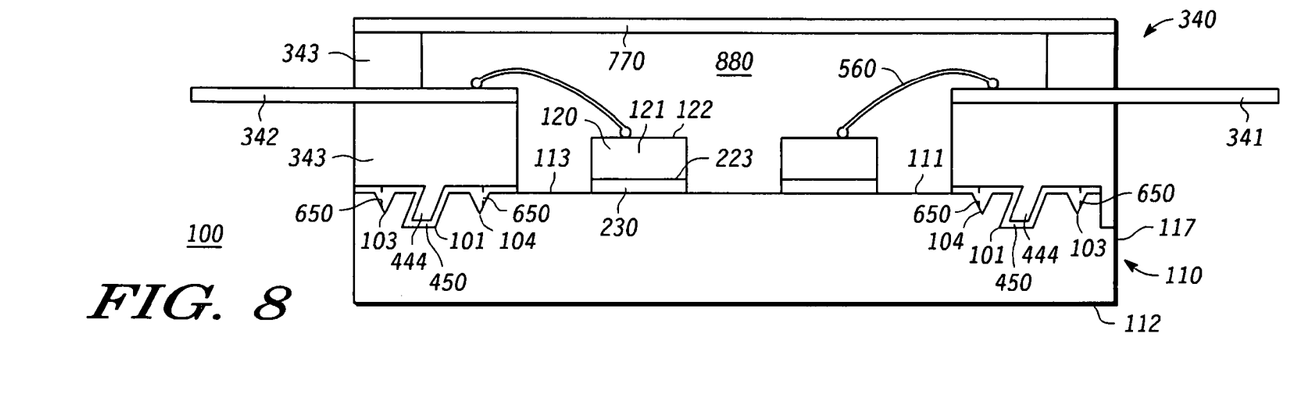
FIG. 8 illustrates a cross-sectional view of the semiconductor structure in FIG. 7, as viewed along a section line 8-8 in FIG. 7, in accordance with an embodiment of the invention.

FIG. 7 illustrates a top view of semiconductor structure 100 during a subsequent step of the assembly process, and FIG. 8 illustrates a cross-sectional view of semiconductor structure 100 as viewed along a section line 8-8 in FIG. 7. Semiconductor structure 100 includes a lid 770 located over substrate 110, semiconductor chips 120, and electrical isolator structure 340. Lid 770 protects semiconductor chips 120 and wire bonds 560 from physical and environmental damage. Lid 770 can be coupled to organic-based element 343 and/or electrical leads 341 and 342. As an example, lid 770 can be comprised of a liquid crystal polymer (LCP), ceramic, or other non-electrically conductive material. Lid 770 can have many different configurations, including a recess to accommodate higher wire bonds.

Substrate 110, organic-based element 343 of electrically isolated structure 340, electrical leads 341 and 342 of electrically isolated structure 340, adhesive element 450, and lid 770 form at least a gross leakage sealed package having an air gap 880 in which semiconductor chips 120 and wire bonds 560 are located. In a different embodiment, semiconductor structure 100 is a hermetically sealed package.

In one embodiment, semiconductor devices 121 in semiconductor chips 120 are high power, radio frequency devices so the package is a high power, radio frequency package. In the same or different embodiment, air gap 880 can be comprised of other materials such as, for example, nitrogen or another inert gas.

Figure 9:
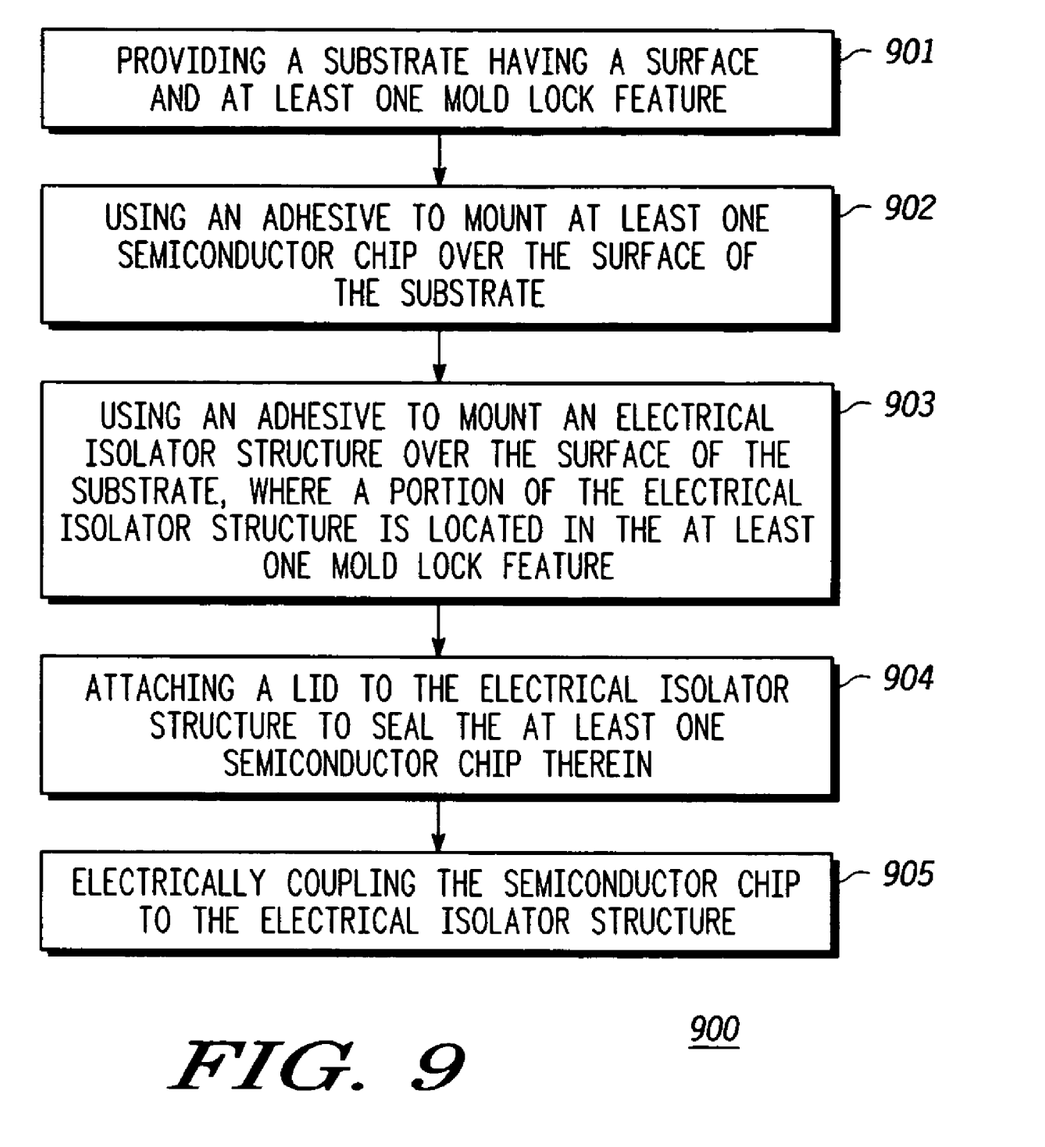
FIG. 9 illustrates a flow chart of a method of assembling a semiconductor structure or semiconductor packaging system in accordance with an embodiment of the invention.

FIG. 9 illustrates a flow chart 900 of a method of assembling a semiconductor structure. As an example, the semiconductor structure of flow chart 900 can be similar to semiconductor packaging system or semiconductor structure 100 of FIGS. 1-8 and all of its various embodiments. Flow chart 900 includes a step 901 for providing a substrate having a surface and at least one mold lock feature. As an example, the substrate of step 901 can be similar to substrate 110 in FIGS. 1 and 2, and the surface and the mold lock feature of step 901 can be similar to surface 111 and mold lock feature 101 in FIGS. 1 and 2. In one embodiment, the substrate of step 901 can also include one or more dams, which can be similar to dams 103 and 104 in FIGS. 1 and 2. In the same or a different embodiment, the substrate of step 901 can include one or more alignment features, which can be similar to alignment feature 102 in FIGS. 1 and 2.

Flow chart 900 continues with a step 902 for using an adhesive to mount at least one semiconductor chip over the surface of the substrate. As an example, the adhesive and the semiconductor chip of step 902 can be similar to semiconductor chips 120 and adhesive 230, respectively, in FIGS. 1 and 2.

In an embodiment where one or more matching elements are used in the semiconductor structure, step 902 can include mounting the matching element(s) to or over the surface of the substrate. In this embodiment, the matching element(s) can be mounted before, simultaneously with, or after the semiconductor chip(s).

After step 902, flow chart 900 continues with a step 903 for using an adhesive to mount an electrical isolator structure over the surface of the substrate, where a portion of the electrical isolator structure is located in the at least one mold lock feature. Step 903 can include mating and/or snapping the portion of the electrical isolator structure into the at least one mold lock feature, as explained previously with respect to FIG. 4.

The adhesive and the electrical isolator structure in step 902 can be similar to adhesive element 450 and electrical isolator structure 340, respectively, in FIGS. 3 and 4. Additionally, the portion of the electrical isolator structure in step 902 can be similar to portion 444 of electrical isolator structure 340 in FIG. 4. As explained previously with respect to FIG. 6, a portion of the adhesive in step 903 can be located in the at least one mold lock feature. In an embodiment where the substrate includes one or more dams, the dams can prevent or at least inhibit run-out problems for the adhesive of step 903. In an embodiment where the substrate of step 901 includes an alignment feature, step 902 can include mating a portion of the electrical isolator structure with, or positioning a portion of the electrical isolator structure in, the alignment feature.

In the preferred embodiment, after step 903, flow chart 900 continues with a step 904 for electrically coupling the semiconductor chip to the electrical isolator structure. As an example, wire bonds 560 and other the interconnect structures described with reference to FIGS. 5 and 6 can be used during step 904 to electrically couple the semiconductor device of the semiconductor chip to the electrical leads of the electrical isolator structure.

Flow chart 900 also includes a step 905 for attaching a lid to the electrical isolator structure to seal the at least one semiconductor chip therein. As an example, the lid of step 905 can be similar to lid 770 in FIGS. 7 and 8. In one embodiment, the lid hermetically or at least gross leak seals the semiconductor chip within the semiconductor structure. In the same or different embodiment, step 905 can use epoxy or other adhesives to attach the lid to the electrical isolator structure, or step 904 can use sonic, ultrasonic, thermal, or other welding techniques to accomplish the same. In an alternative embodiment, step 905 can attach the lid to the surface of the substrate. In another alternative embodiment, step 905 can be performed simultaneously with step 903, or step 905 can be performed prior to step 903.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent to one of ordinary skill in the art that the configuration, geometry, shape, and size of electrical isolator structure 340 in FIGS. 3 and 4 and of mold lock feature 101, alignment feature 102, and dams 103 and 104 in FIGS. 1 and 2, respectively, may vary, and that the foregoing discussion of certain of these embodiments does not necessarily represent a complete description of all possible embodiments. Similarly, the material compositions of the various elements of semiconductor structure 100 may vary from the details described above. For example, adhesive element 450 can be comprised of a solder material.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor structure comprising:
a substrate having a first surface with a mold lock feature;
a semiconductor chip located over the first surface of the substrate;
an electrical isolator structure located over the first surface of the substrate, wherein the electrical isolator structure comprises an electrical lead and an electrically insulative element molded to the electrical lead; and
an adhesive element located between and coupling the electrical isolator structure and the first surface of the substrate,
wherein:
a portion of the electrical lead is located over a portion of the mold lock feature.

2. The semiconductor structure of claim 1 wherein:
a portion of the adhesive element is located in the mold lock feature.

3. A semiconductor structure comprising:
a substrate having a first surface with a mold lock feature;
a semiconductor chip located over the first surface of the substrate;
an electrical isolator structure located over the first surface of the substrate, wherein the electrical isolator structure comprises an electrical lead and an electrically insulative element; and
an adhesive element located between and coupling the electrical isolator structure and the first surface of the substrate,
wherein:
a portion of the electrical isolator structure snaps together with the mold lock feature.

4. The semiconductor structure of claim 3 wherein:
a portion of the adhesive element is located in the mold lock feature.

5. A semiconductor structure comprising:
a substrate having a first surface with a mold lock feature;
a semiconductor chip located over the first surface of the substrate;
an electrical isolator structure located over the first surface of the substrate, wherein the electrical isolator structure comprises an electrical lead and an electrically insulative element; and
an adhesive element located between and coupling the electrical isolator structure and the first surface of the substrate,
wherein:
a portion of the electrical isolator structure mates with the mold lock feature.

6. The semiconductor structure of claim 5 wherein:
a portion of the adhesive element is located in the mold lock feature.

7. A semiconductor structure comprising:
a substrate having a first surface with a mold lock feature;
a semiconductor chip located over the first surface of the substrate;
an electrical isolator structure located over the first surface of the substrate, wherein the electrical isolator structure comprises an electrical lead and an electrically insulative element; and
an adhesive element located between and coupling the electrical isolator structure and the first surface of the substrate,
wherein:
a portion of the electrical isolator structure is located in the mold lock feature; and
the portion of the electrical isolator structure is conformal to the mold lock feature.

8. The semiconductor structure of claim 1 wherein:
the mold lock feature is a recess.

9. A semiconductor structure comprising:
a substrate having a first surface with a mold lock feature;
a semiconductor chip located over the first surface of the substrate;
an electrical isolator structure located over the first surface of the substrate, wherein the electrical isolator structure comprises an electrical lead and an electrically insulative element; and
an adhesive element located between and coupling the electrical isolator structure and the first surface of the substrate,
wherein:
the mold lock feature is a recess;
a portion of the electrical isolator structure is located in the mold lock feature; and
the portion of the electrical isolator structure is a protrusion.

10. A semiconductor packaging system comprising:
a flange comprised of an electrically conductive material and having a first surface with at least one mold lock recess;
at least one semiconductor chip having at least one semiconductor device located over and electrically coupled to the first surface of the flange, wherein the at least one semiconductor device is an active device;
at least one matching element located over the first surface of the flange;
an adhesive element coupling the at least one semiconductor chip to the first surface of the flange;
a frame structure comprised of at least two electrical leads and an organic-based, electrically insulative element, wherein a first portion of the organic-based, electrically insulative element is located over the first surface and mated with the at least one mold lock recess;
an epoxy element located between and coupling the frame structure and the first surface of the flange, wherein a first portion of the epoxy element is located in the at least one mold lock recess; and
interconnect structures electrically coupling the at least one semiconductor device and the at least one matching element to the at least two electrical leads; and
a lid located over the flange and the frame structure to at least gross leak seal the at least one semiconductor chip and the at least one matching element therein.

11. The semiconductor packaging system of claim 10 wherein:
the at least one mold lock recess is a mechanical reinforcement of an interface between the frame structure and the flange.

12. The semiconductor packaging system of claim 10 wherein:
the first surface of the flange has a first alignment recess;
the organic-based, electrically insulative element has a second portion located in the first alignment recess; and
the first alignment recess aligns together the frame structure and the flange.

13. The semiconductor packaging system of claim 12 wherein:
the epoxy element has a second portion located in the first alignment recess.

14. The semiconductor packaging system of claim 12 wherein:
the first surface of the flange has a second alignment recess;
the organic-based, electrically insulative element has a third portion located in the second alignment recess; and
the first and second alignment recesses align together the frame structure and the flange.

15. The semiconductor packaging system of claim 14 wherein:
the first surface of the flange has a first side and a second side adjacent to the first side; and
the first alignment recess is located at the first side of the first surface and forms a portion of an edge of the first surface; and
the second alignment recess is located at the second side of the first surface.

16. The semiconductor packaging system of claim 15 wherein:
the epoxy element has a second portion located in the first alignment recess; and
the epoxy element has a third portion located in the second alignment recess.

17. The semiconductor packaging system of claim 10 wherein:
the first surface of the flange has an epoxy dam recess.

18. The semiconductor packaging system of claim 17 wherein:
the epoxy dam recess is located between the at least one mold lock recess and a center of the flange.

19. The semiconductor packaging system of claim 17 further comprising:
the first surface of the flange has a first alignment recess;
the organic-based, electrically insulative element has a second portion located in the first alignment recess; and
the first alignment recess aligns together the frame structure and the flange.

20. The semiconductor packaging system of claim 19 wherein:
the first alignment recess forms a portion of an edge of the first surface of the flange.

21. The semiconductor packaging system of claim 10 wherein:
the first surface of the flange has a first portion comprising a solderable surface;
the at least two semiconductor chips are soldered to the first portion of the first surface of the flange by the adhesive element;
the at least one mold lock recess is located between the first portion of the flange and an edge of the first surface of the flange;
the at least one mold lock recess is devoid of a solderable surface; and
a second portion of the first surface of the flange located between the first portion of the first surface of the flange and the edge of the first portion of the first surface of the flange comprises a non-solderable surface.

22. The semiconductor structure of claim 1 further comprising:
one or more wire bonds electrically coupling the semiconductor chip to the electrical lead.

23. The semiconductor structure of claim 1 wherein:
the substrate further comprises an alignment recess.

24. The semiconductor structure of claim 5 wherein:
the substrate further comprises an alignment recess.

25. The semiconductor structure of claim 7 further comprising:
the substrate further comprises an alignment recess.

26. The semiconductor structure of claim 9 wherein:
the substrate further comprises an alignment recess.

27. The semiconductor structure of claim 9 wherein:
the electrical isolator structure comprises at least one of a plastic polymer, a thermoplastic, and a thermoset plastic.

* * * * *